(12) United States Patent
Amick et al.

(10) Patent No.: US 6,704,680 B2
(45) Date of Patent: Mar. 9, 2004

(54) METHOD FOR DECOUPLING CAPACITOR OPTIMIZATION FOR A TEMPERATURE SENSOR DESIGN

(75) Inventors: Brian Amick, Austin, TX (US); Claude Gauthier, Fremont, CA (US); Pradeep Trivedi, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 52 days.

(21) Appl. No.: 10/075,205

(22) Filed: Feb. 14, 2002

(65) Prior Publication Data
US 2003/0154048 A1 Aug. 14, 2003

(51) Int. Cl.⁷ .............. G05F 3/02; H01L 35/00; G01R 31/02
(52) U.S. Cl. .............. 702/130; 702/117; 327/512; 324/760
(58) Field of Search ............... 327/512, 517, 327/552, 67; 702/130, 99, 117, 132; 374/173; 324/760, 158.1

(56) References Cited

U.S. PATENT DOCUMENTS

| | | | | |
|---|---|---|---|---|
| 6,055,489 A | * | 4/2000 | Beatty et al. | 702/130 |
| 6,337,595 B1 | * | 1/2002 | Hsu et al. | 327/538 |
| 6,396,137 B1 | * | 5/2002 | Klughart | 257/691 |
| 6,476,663 B1 | * | 11/2002 | Gauthier et al. | 327/513 |
| 6,483,341 B2 | * | 11/2002 | Gauthier et al. | 326/30 |
| 6,566,900 B2 | * | 5/2003 | Amick et al. | 324/760 |

* cited by examiner

*Primary Examiner*—Kamini Shah
(74) *Attorney, Agent, or Firm*—Rosenthal & Osha L.L.P.

(57) ABSTRACT

A method for optimizing a decoupling capacitance for an on-chip temperature sensor is provided. A representative power supply waveform having noise is input into a simulation of the on-chip temperature sensor; a difference between a temperature representative input and a temperature dependent output of the on-chip temperature sensor is determined; and an amount of the decoupling capacitance is adjusted until the difference falls below a pre-selected value. A computer system for optimizing a decoupling capacitance for an on-chip temperature sensor is also provided. A computer-readable medium having recorded thereon instructions executable by a processor for optimizing a decoupling capacitance for an on-chip temperature sensor is further provided.

33 Claims, 4 Drawing Sheets

METHOD FOR DECOUPLING CAPACITOR OPTIMIZATION FOR A TEMPERATURE SENSOR DESIGN

BACKGROUND OF INVENTION

To increase processor performance, clock frequencies used by microprocessors, often referred to as "CPUs," have increased. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As processor performance continues to increase, the result has been a larger number of circuits switching at faster rates. Thus, from a design perspective, important considerations such as power, switching noise, and signal integrity must be taken into account.

Higher frequencies and data throughput cause a processor to consume increased power and run at increased temperatures. Extreme temperatures can slow the speed of transistors that may cause some CPU activities to be incomplete at the end of a cycle. The effect may lead to loss of data in a CPU or incorrect results; therefore, on-chip temperature sensors are employed for monitoring. The availability of temperature information allows the CPU to reduce the number of activities and/or slow the operating frequency. If scaling the number of activities does not alleviate the condition, a standby or power down mode may be entered to protect the CPU. Accurate temperature information is important to prevent over heating or unnecessary reduction in CPU activities.

Higher frequencies for an increased number of circuits also increases switching noise on the power supply. The switching noise may have a local or global effect. Circuits that create large amounts of noise may be relatively isolated; however, they may also affect other circuits, possibly involving very complex interactions between the noise generation and the function of affected circuits. If the components responsible for carrying out specific operations do not receive adequate power in a timely manner, computer system performance is susceptible to degradation. For example, on-chip temperature sensor accuracy varies with power supply noise. Thus, providing power to the components in a computer system in a sufficient and timely manner has become an issue of significant importance.

Often, power supplied to a computer system component varies due to switching by active circuits, which in turn, affects the integrity of the component's output. Typically, this power variation results from parasitics between a power supply for the component and the component itself. These parasitics may lead to the component not receiving power (via current) at the exact time it is required. One approach used by designers to combat this performance-inhibiting behavior is introducing decoupling capacitance to a particular circuit by positioning one or more decoupling capacitors close to the component. These decoupling capacitors store charge from the power supply and distribute the charge to the component when needed. For example, if power received by a component from a power supply has noise, one or more decoupling capacitors will distribute charge to the component to ensure that the component is not affected by the power variation on the power supply. In essence, a decoupling capacitor acts as a local power supply for one or more specific components in a computer system.

For a circuit designer to appropriately design an on-chip temperature sensor, a good understanding of the behavior of the system is required. FIG. 1 shows a section of a typical power supply network (100) of a computer system. The power supply network (100) may be representative of a single integrated circuit, or "chip", or equally an entire computer system comprising multiple integrated circuits. The power supply network (100) has a power supply (112) that provides power through a power supply line (114) and a ground line (116) to an impedance network $Z_1$ (118). The impedance network is a collection of parasitic elements that result from inherent resistance, capacitance, and/or inductance of physical connections. A power supply line (122, 123) and a ground line (124, 125) supply power to a circuit A (120) and circuit B (126), respectively. Power supply line (123) and ground line (125) also supply power to circuit C (130) through another impedance network $Z_2$ (128) and additional impedance networks and circuits, such as impedance network $Z_n$ (132) and circuit N (134). The impedance network and connected circuits may be modeled so that the designer, using a simulator, can better understand the behavior of how the circuits interact and interdependencies that exist.

Still referring to FIG. 1, circuit A (120), circuit B (126), circuit C (130), and circuit N (134) may be analog or digital circuits. Also, circuit A (120), circuit B (126), circuit C (130), and circuit N (134) may generate and/or be susceptible to power supply noise. For example, circuit C (130) may generate a large amount of power supply noise that affects the operation of both circuit B (126) and circuit N (134). The designer, in optimizing the performance of circuit B (126) and circuit N (134), requires an understanding of the characteristics of the power supply noise. By understanding the characteristics of the power supply noise, the designer has a foundation on which to use a variety of design techniques to minimize the amount of power supply noise. One such technique, as discussed above, is the addition of decoupling capacitance. For example, decoupling capacitor $C_N$ (136) located between a power supply line (133) and a ground line (135) may be added to reduce power supply noise. The amount of capacitance, due to the large amount needed for some designs, is an issue of significant importance.

SUMMARY OF INVENTION

According to one aspect of the present invention, a method for optimizing a decoupling capacitance for an on-chip temperature sensor comprises inputting a representative power supply waveform having noise to a simulation of the on-chip temperature sensor, determining a difference between a temperature representative input and a temperature dependent output of the on-chip temperature sensor, adjusting an amount of the decoupling capacitance, and repeating the inputting and determining the difference until the difference falls below a pre-selected value.

According to another aspect of the present invention, a computer system for optimizing a decoupling capacitance for an on-chip temperature sensor, comprises a processor, a memory, and software instructions stored in the memory adapted to cause the computer system to input a representative power supply waveform having noise to a simulation of the on-chip temperature sensor, determine a difference between a temperature representative input and a temperature dependent output of the on-chip temperature sensor, adjust an amount of the decoupling capacitance, and repeat the input and determine the difference until the difference falls below a pre-selected value.

According to another aspect of the present invention, a computer-readable medium having recorded thereon instructions executable by a processor, the instructions adapted to input a representative power supply waveform having noise to a simulation of an on-chip temperature sensor, determine a difference between a temperature representative input and a temperature dependent output of the on-chip temperature sensor, adjust an amount of a decoupling capacitance, and repeat the input and determine the difference until the difference falls below a pre-selected value.

Other aspects and advantages of the invention will be apparent from the following description and the appended claims.

DETAILED DESCRIPTION

Embodiments of the present invention relate to a method for optimizing decoupling capacitance for an on-chip temperature sensor. Embodiments of the present invention further relate to a computer system for optimizing decoupling capacitance for an on-chip temperature sensor. Embodiments of the present invention also relate to a program executed on a computer for optimizing decoupling capacitance for an on-chip temperature sensor.

Figure 1:
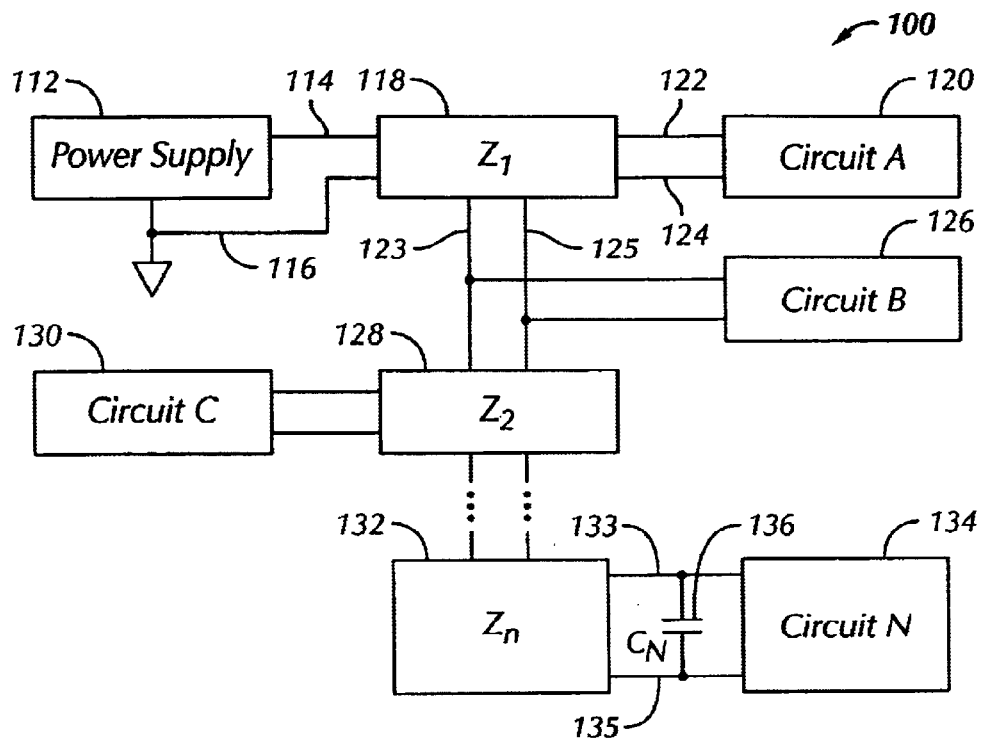
FIG. 1 shows a typical computer system power supply network.

In FIG. 1, the impedance networks (118, 128, 132) may be very complex arrangements of passive elements. The impedances may be the result of, but not limited to, a power supply connection, bulk capacitors, printed circuit board planes, printed circuit board vias, ceramic capacitors, printed circuit board to chip package connections, chip package planes, chip package vias, chip package capacitors, chip package to chip bump or bond wire connections, chip local and global decoupling capacitors, and switching and non-switching circuit elements. A "chip package" for the purpose of this description of the invention may be any package that allows mounting an integrated circuit to a printed circuit board. An integrated circuit, or die, is also referred to as a "chip" in this description. Also, each of the circuits (120, 126, 130, 134) in FIG. 1 may induce power supply noise on the impedance networks (118, 128, 132). The power supply noise characteristics can result from interactions between the circuits (120, 126, 130, 134) coupled with the impedance networks (118, 128, 132).

One of the techniques available to a circuit designer to reduce power supply noise is the addition of decoupling capacitance as previously explained. In FIG. 1, decoupling capacitor $C_N$ (136) is located near circuit N (134) to reduce noise. The addition of decoupling capacitance helps reduce noise by providing power in a sufficient and timely manner. In circuits that are impacted directly by power supply noise, such as an on-chip temperature sensor, the amount of capacitance required may be extremely large. As the amount of decoupling capacitance increases, the physical area occupied also increases, hence cost.

For a designer to adequately determine the amount of decoupling capacitance needed, the behavior of the power supply noise must be understood. A simulation model is desirable. The simulation model is input into a simulation tool so that a computer can calculate the effects of one or more input excitations.

One example of a simulation tool is SPICE, which is an acronym for Simulation Program with Integrated Circuit Emphasis. Modeling a complex array of impedances is difficult, however. Furthermore, even if an accurate simulation model is created, the computing overhead necessary to simulate one or more circuits with the impedance model network may be too great.

Figure 2:
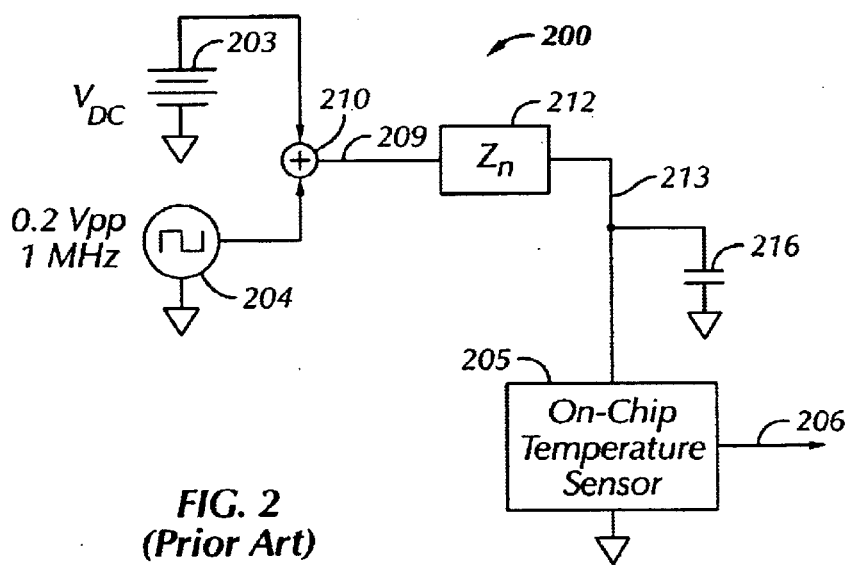
FIG. 2 shows an on-chip temperature sensor circuit test arrangement.

In the absence of an accurate model, worst case simulations are often used. In FIG. 2, a test arrangement (200) for an on-chip temperature sensor (205) is shown. The on-chip temperature sensor (205) is supplied by a DC power supply (203). In this example, the on-chip temperature sensor (205) uses a temperature representative input to generate a temperature dependent output (206) such as a binary representation of the measured temperature. Ideally, the value represented by the binary representation would linearly corresponds to the temperature representative input; however, due to power supply noise, the binary representation may be inaccurate. A low frequency square wave used to simulate power supply noise is one of the most extreme power supply noise tests that can be performed. For example, to model the power supply noise, a square wave generator (204) supplies a peak-to-peak voltage signal which is approximately 20% of the DC power supply (203) voltage. For example, a 0.2 V peak-to-peak square wave may be used with a 1.0 V DC power supply. The square wave generator (204) signal is added to the DC power supply (203) at adder (210). The combined DC power supply (203) and square wave generator (204) output is supplied on power supply line (209) to an impedance network $Z_N$ (212) that is composed of various parasitic elements. Impedance network $Z_N$ (212) may affect the characteristics of the power supply on power supply line (209). Power supply line (213) supplies power from the impedance network $Z_N$ (212) to the on-chip temperature sensor (205). For example, the combined DC power supply (203) and square wave generator (204) output on power supply line (209) may represent a worst case condition on a printed circuit board. The parasitic elements in impedance network $Z_N$ (212) may represent the path from the printed circuit board to the on-chip temperature sensor (205). By adding decoupling capacitance (216), the effect of the power supply noise may be minimized. The voltage of the DC power supply (203), frequency and amplitude of the square wave generator (204), and temperature representative input may be changed to model different operating points.

In FIG. 2, because the noise generated by the square wave generator (204) may exceed typical power supply noise, the amount of decoupling capacitance needed to reduce the noise to an acceptable level as determined by simulating power supply noise with a square wave may be too high. The actual decoupling capacitance (216) needed in the design to meet the desired specifications may be much smaller than that suggested by modeling power supply noise as a square wave.

Those skilled in the art will appreciate that the temperature representative input of an on-chip temperature sensor may be a variety of different signals including, but not limited to, a temperature, a numerical value representing a temperature, a temperature representative voltage, and a temperature representative current. Those skilled in the art will also appreciate that the temperature dependent output of an on-chip temperature sensor may have a variety of different signal outputs including, but not limited to, a numerical value representing a temperature, a binary representation of a temperature, a temperature dependent frequency, a temperature dependent voltage, a temperature dependent current, and a temperature dependent pulse width modulation.

Figure 3:
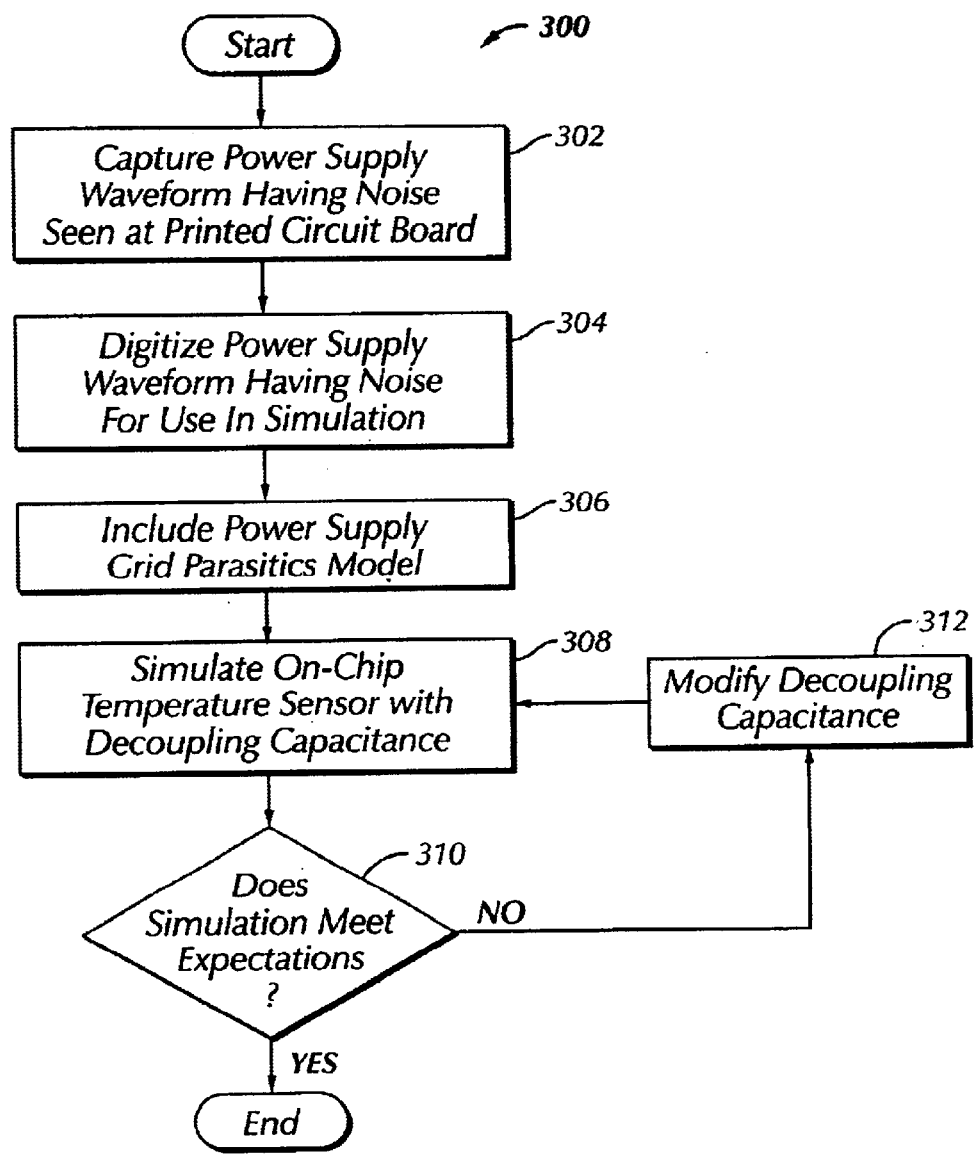
FIG. 3 shows a flow process in accordance with an embodiment of the present invention.

In FIG. 3, an exemplary flow process (300) in accordance with an embodiment of the present invention is shown. At (302), a power supply waveform having noise is captured. A power supply waveform having noise for the purpose of this description may be any power supply that has deviations from a designed voltage. This power supply waveform is captured at some particular location within a power supply network. Those skilled in the art will appreciate that the noise in the captured power supply waveform comes from a dominant source of noise. A circuit under design does not provide a substantial contribution to the noise in the captured power supply waveform. The power supply waveform having noise may be used to adequately represent a large portion of the power supply network and associated circuitry.

In FIG. 1, for example, circuit C (130) may be the dominant source of noise. The temperature sensor under design may be circuit N (134). By capturing a power supply waveform having noise between impedance networks $Z_2$ (128) and $Z_n$ (132), a system response that represents a large portion of the power supply network and associated circuitry is used. For example, the power supply network and associated circuitry may include the power supply (112), impedance network $Z_1$ (118), circuit A (120), circuit B (126), circuit C (130), and impedance network $Z_2$ (128). Because the dominant source (circuit C (130)) is included in the power supply network and associated circuitry, a simulation using the power supply waveform having noise, impedance network $Z_n$ (122), circuit N (134) and decoupling capacitor $C_N$ (136) is sufficient.

With regard to simulating a CPU circuit, capturing a power supply waveform on a printed circuit board near the CPU is desirable. The captured power supply waveform will also contain noise as a result of activities on the printed circuit board by one or more circuits. The captured power supply waveform may be the result of physically measuring the voltage on the printed circuit board under operating conditions with measuring equipment. These operating conditions may include extreme conditions in an effort to capture a worst case power supply waveform having noise. These operating conditions may be the result of varying one or more of the following: temperature, voltage, frequency, and manufacturing process. The captured power supply waveform may also be the result of a simulation of some portion of the power supply network. For the purposes of this description, a representative power supply waveform comprises an approximation of an actual power supply waveform as occurs in a realistic system. By capturing the power supply waveform at an intermediate point in the power supply network, a division in design responsibilities and expertise is achieved. A power supply network designer may focus on design and simulation of a portion of the power supply network while a circuit designer may capture representative power supply signals at an appropriate location to be used as an input to designed circuits.

The captured power supply waveform is digitized at (304) to be input to a simulation program. The digitization may be a direct point by point representation. The digitization may also be a representative model of the waveform that may include a formulated representation in which an equation characterizes the power supply waveform having noise. Capturing and digitizing the power supply waveform does not preclude the addition of circuits to model another portion of the power supply network not represented in the captured and digitized power supply waveform. This additional portion of the power supply network may be used between the captured power supply waveform and the circuit under design. At (306), elements may be added to the simulation to represent additional power supply network components. For example, a captured power supply signal may be captured on a printed circuit board; however, the circuit to be designed resides on an integrated circuit. At (306), the power supply network elements that may be added include, but are not limited to, connections (parasitics) between the printed circuit board and chip package, connections (parasitics) between the chip package and chip, and connections (parasitics) between the chip power supply network and circuit under design. These added elements may improve the modeling of the actual passive parasitics. At (308), the on-chip temperature sensor under design along with decoupling capacitance is simulated using the digitized power supply waveform having noise captured from the printed circuit board at (304) and the parasitics from (306). At (308), the computational overhead of the simulation is reduced due to the input of the power supply waveform having noise being used instead of a portion of the power supply network that may contain a large number of elements. Also, the simulation of the on-chip temperature sensor at (308) is more accurate because the digitized power supply waveform having noise is used instead of a square wave or other pessimistic estimate.

As the results of the simulation are analyzed, a decision is made in (310) as to whether the results meet expectations. At (310), the results of the simulation must meet specifications; however, the designer may have guard band or design goal expectations that improve upon the specification. For example, the accuracy of the on-chip temperature sensor may be compared against a specification. If the expectations are not met, (312) is followed to modify the design and/or amount of the decoupling capacitance. (308), (310), and (312) are repeated until satisfactory results occur. For example, the amount of decoupling capacitance may be increased until the accuracy of the on-chip temperature sensor meets or improves upon a specification.

Those skilled in the art will appreciate that the captured power supply waveform having noise may be obtained from probing a physical system, such as a printed circuit board, chip package, or chip, under various operating conditions. Operating conditions include, but are not limited to, temperature, voltage, frequency, and manufacturing (process) variations. Those skilled in art will also appreciate that the captured power supply waveform having noise may be obtained from probing an integrated circuit under various operating conditions. Furthermore, those skilled in the art will appreciate that the power supply waveform having noise obtained from a physical system may be obtained from a location adjacent to an intended location of the on-chip temperature sensor under various operating conditions. Those skilled in the art will further appreciate that using the power supply waveform having noise in place of a portion of the power supply network reduces the computational load when simulating the circuit.

Those skilled in the art will appreciate that the captured power supply signal having noise may be obtained from simulation data of a modeled printed circuit board's parasitics under various operating conditions. Furthermore, those skilled in art will appreciate that the captured power supply waveform having noise may be obtained from simulation data of a power supply network's parasitics that may include, but is not limited to, the motherboard power supply network, motherboard to integrated circuit connections, and/or integrated circuit power supply network under various operating conditions. Operating conditions include, but are not limited to, temperature, voltage, frequency, and manufacturing (process) variations. Those skilled in the art will further appreciate that the simulation of the circuit using the power supply waveform having noise may be dependent on various operating conditions. Those skilled in the art will also appreciate that the simulation tool used to simulate the power supply waveform having noise does not have to be the same simulation tool used to simulate the circuit using the power supply waveform having noise.

Those skilled in the art will appreciate that capturing the power supply signal having noise, whether from a physical system or simulation, may advantageously be obtained adjacent to an intended location of the on-chip temperature sensor.

Those skilled in the art will appreciate that the noise may be captured separately from the power supply waveform and combined to create the power supply waveform having noise.

Those skilled in the art will appreciate that multiple power supply waveforms having noise may be used simultaneously, and the multiple power supply waveforms having noise may be connected to different locations on the power supply network. Those skilled in the art will further appreciate that the on-chip temperature sensor and additional active circuits may be used in the simulation at (308).

Those skilled in the art will appreciate that the on-chip temperature sensor may be analog, digital, or a combination of both types of circuits.

Those skilled in the art will appreciate that the simulation of the on-chip temperature sensor may be dependent on at least one selected from the group consisting of temperature, voltage, frequency, and manufacturing process.

Figure 4:
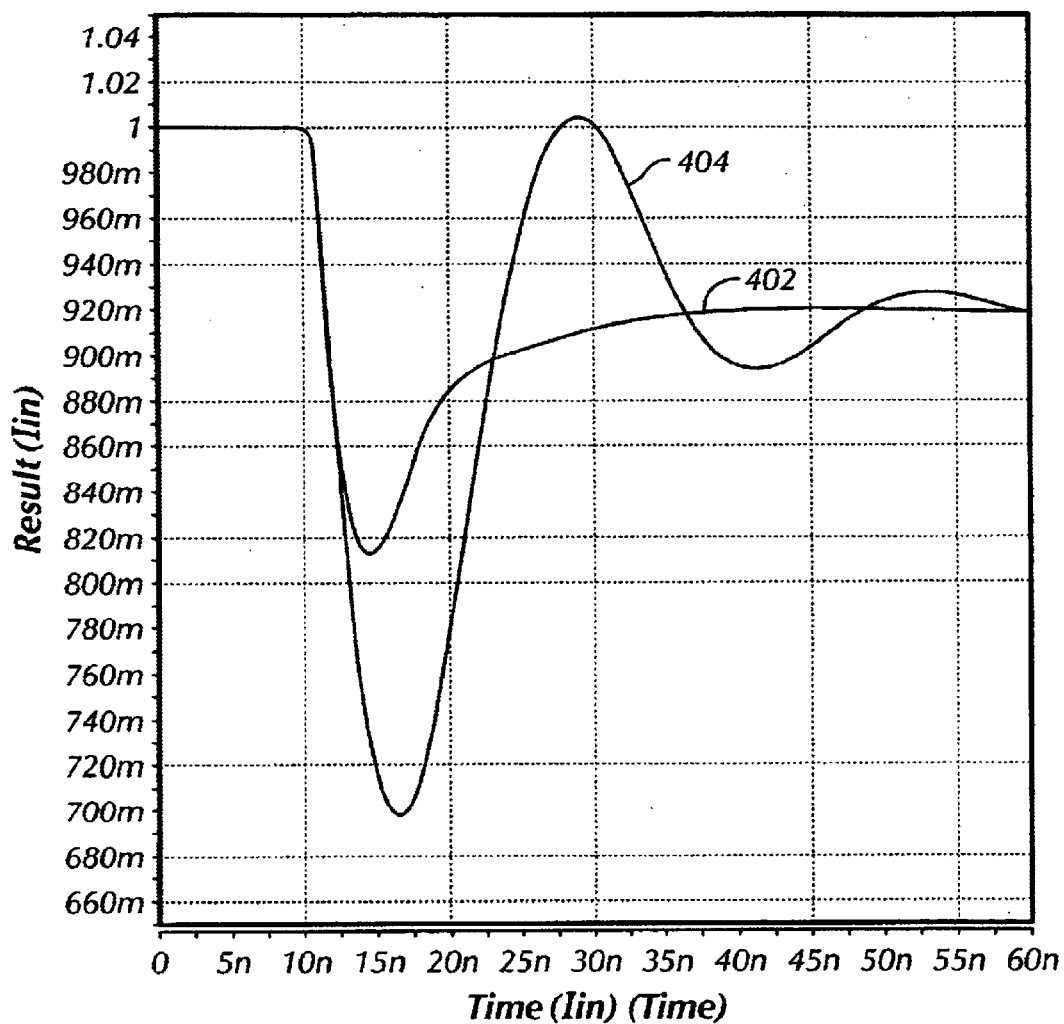
FIG. 4 shows captured power supply waveforms in accordance with another embodiment of the present invention.

In FIG. 4, two captured power supply waveforms having noise (402, 404), in accordance with various embodiments of the present invention, are shown. Power supply waveform having noise (402, 404) can be digitized or modeled, and operatively used as the power supply input to the circuit simulation. Both captured power supply waveforms start at time zero at approximately 1 V. At 10 ns, one or more circuits interacting with one or more impedance networks create noise on the power supply waveforms. For power supply waveform (402), the noise effect is reduced compared to power supply waveform (404). Depending on the needs of a circuit designer, either power supply waveform (402, 404) can be digitized or modeled, and operatively used as the power supply input to the circuit simulation.

Those skilled in the art will appreciate that power supply waveform (402) and power supply waveform (404) may have been captured under different operating conditions. Those skilled in the art will further appreciate that power supply waveform (402) and power supply waveform (404) may have been captured at different locations within the power supply network.

Figure 5:
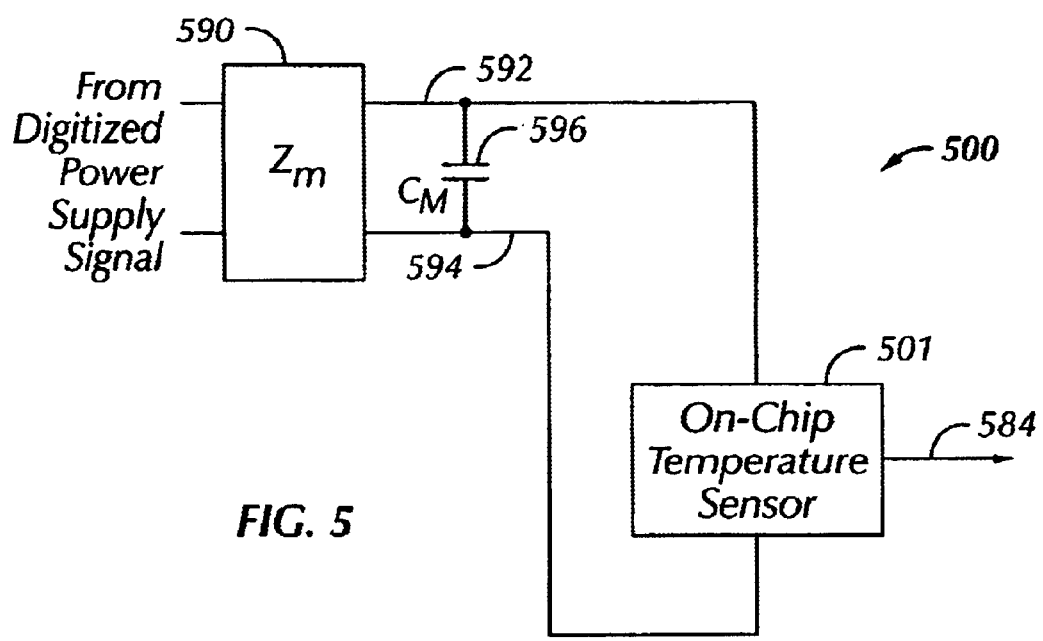
FIG. 5 shows a circuit in accordance with another embodiment of the present invention.

In FIG. 5, an exemplary circuit (500) in accordance with another embodiment of the present invention is shown. A block diagram drawing of a on-chip temperature sensor (501) is shown. The on-chip temperature sensor (501) has a temperature representative input sensed by the on-chip temperature sensor (501). The on-chip temperature sensor (501) generates a temperature dependent output (584) such as a binary representation in response to the temperature representative input. Ideally, a relationship between the temperature representative input and the value represented by the binary representation is linear. The value represented by the binary representation, however, is affected by power supply noise.

Still referring to FIG. 5, a power supply waveform having noise has been determined from a power supply network and digitized. The power supply waveform having noise is operatively used either through direct digitization or appropriate modeling such as a formulated representation where an equation describes the signal's characteristics. The power supply waveform having noise is input to an impedance network $Z_M$ (590). The impedance network $Z_M$ (590) supplies power to the on-chip temperature sensor (501) through power supply line (592) and ground line (594). Simulating the on-chip temperature sensor (501) with the representation of the power supply waveform having noise provides a technique to estimate the effect of the power supply noise.

For example, a piece-wise linear representation of the power supply waveform having noise ((402) (in FIG. 4)) may be used to supply the impedance network $Z_M$ (590). The power supply waveform having noise (402) may be acquired from a simulation of a printed circuit board from a dominant power supply noise source. The impedance network $Z_M$ (590) represents additional impedances between the printed circuit board and the on-chip temperature sensor (501) that is located on an integrated circuit. The power supply waveform having noise may disturb the temperature sensor (501) such that the value represented by the binary representation is inaccurate and not within specification. The accuracy of the on-chip temperature sensor (501) is defined for the purposes of this description as the difference between the designed temperature dependent output (584) and the temperature representative input. The addition of properly located decoupling capacitance, such as decoupling capacitor $C_M$ (596), helps reduce the amount of power supply noise, hence improves accuracy. Optimization of the decoupling capacitance $C_M$ (596) is based on the on-chip temperature sensor accuracy using the power supply waveform having noise. Because a realistic power supply waveform having noise is used, the on-chip temperature sensor design and associated decoupling capacitance will not be over designed with respect to temperature inaccuracy. Also, the simulation can be completed in a reasonable amount of time; therefore, the on-chip temperature sensor design and/or the decoupling capacitance may be modified in an iterative fashion to improve the system's performance.

Those skilled in art will appreciate that a computer system is described for inputting a representation of a power supply waveform having noise, using that representation to simulate an on-chip temperature sensor and decoupling capacitance, and estimating accuracy of the on-chip temperature sensor.

Those skilled in art will appreciate that a computer-readable medium having recorded thereon instructions executable by a processor is described to input a representation of a power supply waveform having noise into a simulation of an on-chip temperature sensor and decoupling capacitance, and estimating accuracy of the on-chip temperature sensor.

Advantages of the present invention may include one or more of the following. In some embodiments, because a representative power supply signal having noise is used, a more accurate circuit simulation may be performed. Realistic results help alleviate costly over design. A circuit designed with more accurate power supply waveforms may require a reduced amount of decoupling capacitance, hence reduced chip area. The space saved due to the reduced chip area may be used for additional performance enhancing circuits, or may be used to reduce the final chip size, hence cost.

In some embodiments, because a representation of a power supply signal having noise is used, a circuit simulation that requires less computational load may be performed. Accordingly, more iterations in the design process may be afforded.

In some embodiments, because a representation of a power supply signal having noise is used, tasks involved with designing a power supply network and individual circuits may be advantageously divided and performed by experts in their respective areas of expertise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for optimizing a decoupling capacitance for an on-chip temperature sensor, comprising:
   inputting a representative power supply waveform having noise to a simulation of the on-chip temperature sensor;
   determining a difference between a temperature representative input and a temperature dependent output of the on-chip temperature sensor;
   adjusting an amount of the decoupling capacitance; and
   repeating the inputting and determining the difference until the difference falls below a pre-selected value.

2. The method of claim 1, wherein the representative power supply waveform is obtained from a physical system.

3. The method of claim 2, wherein the physical system comprises a printed circuit board.

4. The method of claim 2, wherein the physical system comprises a chip package.

5. The method of claim 2, wherein the physical system comprises a chip.

6. The method of claim 1, wherein the representative power supply waveform is obtained from a location on a physical system adjacent to an intended location of the on-chip temperature sensor.

7. The method of claim 1, wherein the representative power supply waveform is obtained from a simulation of a power supply.

8. The method of claim 1, wherein the simulation of the power supply is performed using a first simulation tool and the simulation of the on-chip temperature sensor is performed using a second simulation tool.

9. The method of claim 1, wherein the representative power supply waveform comprises a noise waveform combined with a power supply waveform.

10. The method of claim 1, wherein the representative power supply waveform comprises parasitics based on at least one selected from the group consisting of temperature, voltage, frequency, and manufacturing process.

11. The method of claim 1, wherein the simulation of the on-chip temperature sensor is dependent on at least one selected from the group consisting of temperature, voltage, frequency, and manufacturing process.

12. A computer system for optimizing a decoupling capacitance for an on-chip temperature sensor, comprising:
   a processor;
   a memory; and
   software instructions stored in the memory adapted to cause the computer system to:
      input a representative power supply waveform having noise to a simulation of the on-chip temperature sensor;
      determine a difference between a temperature representative input and a temperature dependent output of the on-chip temperature sensor;
      adjust an amount of the decoupling capacitance; and
      repeat the input and determine the difference until the difference falls below a pre-selected value.

13. The computer system of claim 12, wherein the representative power supply waveform is from a physical system.

14. The computer system of claim 13, wherein the physical system comprises a printed circuit board.

15. The computer system of claim 13, wherein the physical system comprises a chip package.

16. The computer system of claim 13, wherein the physical system comprises a chip.

17. The computer system of claim 12, wherein the representative power supply waveform is obtained from a location on a physical system adjacent to an intended location of the on-chip temperature sensor.

18. The computer system of claim 12, wherein the representative power supply waveform is obtained from a simulation of a power supply.

19. The computer system of claim 18, wherein the simulation of the power supply is performed using a first simulation tool and the simulation of the on-chip temperature sensor is performed using a second simulation tool.

20. The computer system of claim 12, wherein the representative power supply waveform comprises a noise waveform combined with a power supply waveform.

21. The computer system of claim 12, wherein the representative power supply waveform comprises parasitics based on at least one selected from the group consisting of temperature, voltage, frequency, and manufacturing process.

22. The computer system of claim 12, wherein the simulation of the on-chip temperature sensor is dependent on at least one selected from the group consisting of temperature, voltage, frequency, and manufacturing process.

23. A computer-readable medium having recorded thereon instructions executable by a processor, the instructions adapted to:
   input a representative power supply waveform having noise to a simulation of an on-chip temperature sensor;
   determine a difference between a temperature representative input and a temperature dependent output of the on-chip temperature sensor;
   adjust an amount of a decoupling capacitance; and
   repeat the input and determine the difference until the difference falls below a pre-selected value.

24. The computer-readable medium of claim 23, wherein the representative power supply waveform is determined from a physical system.

25. The computer-readable medium of claim 24, wherein the physical system comprises a printed circuit board.

26. The computer-readable medium of claim 24, wherein the physical system comprises a chip package.

27. The computer-readable medium of claim 24, wherein the physical system comprises a chip.

28. The computer-readable medium of claim 23, wherein the representative power supply waveform is obtained from a location on a physical system adjacent to an intended location of the on-chip temperature sensor.

29. The computer-readable medium of claim 23, wherein the representative power supply waveform is obtained from a simulation of a power supply.

30. The computer-readable medium of claim 29, wherein the simulation of the power supply is performed using a first simulation tool and the simulation of the on-chip temperature sensor is performed using a second simulation tool.

31. The computer-readable medium of claim 23, wherein the representative power supply waveform comprises a noise waveform combined with a power supply waveform.

32. The computer-readable medium of claim 23, wherein the representative power supply waveform comprises parasitics based on at least one selected from the group consisting of temperature, voltage, frequency, and manufacturing process.

33. The computer-readable medium of claim 23, wherein the simulation of the on-chip temperature sensor is dependent on at least one selected from the group consisting of temperature, voltage, frequency, and manufacturing process.

* * * * *

UNITED STATES PATENT AND TRADEMARK OFFICE
CERTIFICATE OF CORRECTION

PATENT NO.     : 6,704,680 B2
DATED          : March 9, 2004
INVENTOR(S)    : Brian Amick et al.

It is certified that error appears in the above-identified patent and that said Letters Patent is hereby corrected as shown below:

Column 9,
Line 49, please replace "claim 1" with -- claim 7 --.

Signed and Sealed this

Third Day of August, 2004

JON W. DUDAS
*Acting Director of the United States Patent and Trademark Office*